(12) United States Patent
Fujimoto (10) Patent No.: US 6,361,903 B1
(45) Date of Patent: Mar. 26, 2002

(54) METHOD FOR PREDICTING PATTERN WIDTH ON SEMICONDUCTOR WAFER AND METHOD FOR CORRECTING MASK PATTERN THERETHROUGH

(75) Inventor: Masashi Fujimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/549,913

(22) Filed: Apr. 14, 2000

(30) Foreign Application Priority Data

Apr. 16, 1999 (JP) .......................................... 11-109523

(51) Int. Cl.$^7$ ................................................. G03F 9/00
(52) U.S. Cl. ............................................. 430/5; 430/30
(58) Field of Search ....................................... 430/5, 30

Primary Examiner—Christopher G. Young
(74) Attorney, Agent, or Firm—Hayes, Soloway, Hennessey, Grossman & Hage P.C.

(57) ABSTRACT

In a method for predicting a width of a photo-resist pattern, a first optical intensity at mask edges and a second optical intensity at a center of the photo-resist pattern are determined on the basis of a spatial image of a mask pattern to be transferred under reference conditions, and the distance between the mask edges at the first optical intensity and a third intensity at the center of the photo-resist pattern are determined on the basis of a spatial image of the mask pattern to be transferred under actual conditions, wherein the width of the photo-resist pattern is accurately predicted as the product between the distance and the ratio between the second optical intensity and the third optical intensity.

21 Claims, 8 Drawing Sheets

$$CD = 0.187 \times (1-0.1054)/(1-0.0603)$$
$$= 0.178 \mu m$$

$CD = 0.221 \times (1-0.0397)/(1-0.0603)$
$= 0.226 \mu m$

METHOD FOR PREDICTING PATTERN WIDTH ON SEMICONDUCTOR WAFER AND METHOD FOR CORRECTING MASK PATTERN THERETHROUGH

FIELD OF THE INVENTION

This invention relates to a simulation technology and, more particularly, to a method for predicting a pattern width on a semiconductor wafer and a method for correcting a mask pattern on the basis of the result.

DESCRIPTION OF THE RELATED ART

A pattern transfer is an important step in a process for fabricating a semiconductor device. Photo-resist is spread over a semiconductor wafer, and a photo mask is aligned with an area of the semiconductor wafer. The photo mask is radiated with light, and the light carries the pattern image onto the area. A latent image is produced in the photo mask, and is developed in developing solution. Then, the photo-resist layer is formed into a photo-resist pattern. If the photo-resist is of the positive type, part of the area irradiated with the light becomes soluble in the developing solution, and is removed from the semiconductor wafer. The remaining part of the photo-resist layer is left on the semiconductor wafer as the photo-resist pattern.

The pattern to be formed in the photo-resist layer has been miniaturized. When the pattern is miniaturized, the photo-resist pattern is degraded, and the pattern accuracy is lowered. The degradation is not uniform between sorts of pattern such as, for example, a line-and-space pattern, an isolated pattern etc. The phenomena influential in the pattern accuracy is hereinbelow referred to as "optical proximity effect".

The optical proximity effect on the photo-resist pattern is variable depending upon the environments of the pattern transfer such as exposure conditions, i.e., the aberration, the defocus, the dimensional error in the mask pattern and so forth, the developing time and the design method for the mask pattern. In order to exactly design a photo mask, the manufacturer simulates the pattern transfer, and predicts the photo-resist pattern on a semiconductor wafer. Then, the manufacturer feeds back the prediction to the design work for an optical proximity correction, and corrects the photo mask pattern. Thus, the prediction through the simulation is an important technology for the work of designing a photo mask.

A problem is encountered in the prior art in that the prediction is time consuming. The analyst takes the pattern dimensions and sorts of the pattern, which are influenceable by the thickness of a photo-resist layer and the composition of photo-resist, into account, and the simulation requires complicated calculations for the prediction. Moreover, the analyst requires a large amount of experimental data for pattern transfer under different conditions in order to obtain resist patterns at a predetermined depth of focus. The experiments are also time consuming and costly.

SUMMARY OF THE INVENTION

It is therefore an important object of the present invention to provide a method for accurately speedily predicting a pattern width.

It is also an important object of the present invention to provide a method for correcting a mask pattern on the basis of the prediction.

In accordance with one aspect of the present invention, there is provided a method for predicting a width of a pattern transferred from a photo-mask to a photo-sensitive layer comprising the steps of a) determining a first optical intensity at first positions on the photo-sensitive layer corresponding to edges of the photo-mask and a second optical intensity at a second position where the optical intensity is predicted to be weaker than the first optical intensity on the basis of a first spatial image of the pattern calculated under reference exposure conditions, b) determining a distance between third positions approximately equal in optical intensity to the first positions and a third optical intensity at a fourth position corresponding to the second position on the basis of a second spatial image of the pattern calculated under actual exposure conditions and c) predicating the width of the pattern formed in the photo-sensitive layer on the basis of the distance, the second optical intensity and the third optical intensity.

In accordance with another aspect of the present invention, there is provided a method for correcting a pattern to be transferred from a photo-mask to a photo-sensitive layer comprising the steps of a) determining a first optical intensity at first positions on the photo-sensitive layer corresponding to edges of the photo-mask and a second optical intensity at a second position where the optical intensity is predicted to be weaker than the first optical intensity on the basis of a first spatial image of the pattern calculated under reference exposure conditions, b) determining a distance between third positions approximately equal in optical intensity to the first positions and a third optical intensity at a fourth position corresponding to the second position on the basis of a second spatial image of the pattern calculated under actual exposure conditions, c) predicating the width of the pattern formed in the photo-sensitive layer on the basis of the distance, the second optical intensity and the third optical intensity, d) comparing the width predicated at step c) with a target width to see whether or not the pattern on the photo-mask is appropriate and e) redesigning the photo-mask when the answer at step d) is given negative.

BRIEF DESCRIPTION OF THE DRAWINGS

The features and advantages of the methods will be more clearly understood from the following description taken in conjunction with the accompanying drawings in which.

PRINCIPLE OF PREDICTION

Description is hereinbelow made on a principle of prediction according to the present invention. In the following description, an isolated line and a line in a line-and-space pattern are referred to as "line of A micron wide", and exposure conditions where the defocus, the dimensional error and the aberration are assumed to be reference values are simply referred to as "reference conditions". On the other hand, an actual exposure is carried out under the conditions where the defocus, the dimensional error and the aberration may be different from the reference conditions, and the exposure conditions are hereinbelow referred to as "actual conditions". The pattern width is to be predicted under the actual conditions through the method embodying the present invention.

Figure 1:
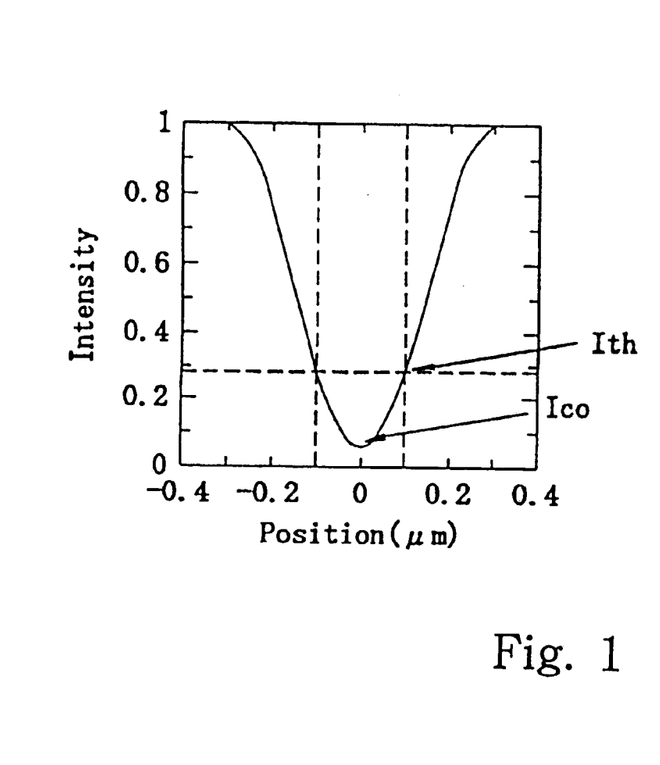
FIG. 1 is a graph showing an optical intensity of a pattern image varied with a position on a photo-sensitive layer under reference conditions.

First, a spatial image of the line of A micron wide is calculated under the reference conditions. The optical intensity Ith at positions corresponding to the mask edge and the optical intensity Ico at the center of a resist image on a semiconductor wafer are determined through calculations. FIG. 1 illustrates the optical intensity Ith and Ico in terms of the position.

Figure 2:
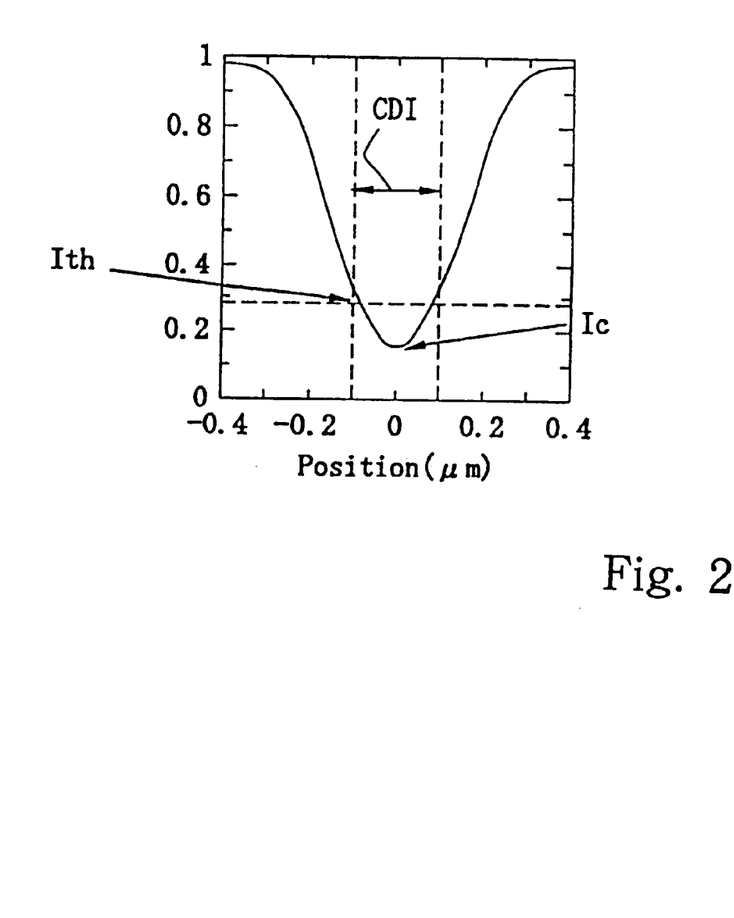
FIG. 2 is a graph showing an optical intensity of a pattern image varied with a position on a photo-sensitive layer under actual conditions.

Similarly, a spatial image of the line of A micron wide is calculated under the actual conditions, and determines two positions at the optical intensity Ith in the spatial image as shown in FIG. 2. The distance between the two positions is labeled with CDI. The optical intensity Ic at the center of a resist image on a semiconductor wafer is calculated.

Subsequently, the solubility of the photo-resist is taken into account. If the optical intensity is weak, the amount of sensitized material of the photo-resist is proportional to the optical intensity. The optical intensity at the center of the resist pattern is weakest in the area where the latent image of the mask pattern is produced. The optical intensity Ico is the weakest optical intensity under the reference conditions, and the optical intensity Ic is the weakest optical intensity under the actual conditions. The ratio between the optical intensity Ic and the optical intensity Ico is assumed to be equivalent to the ratio between the amount of sensitized material under the reference conditions and the amount of sensitized material under the actual conditions. The ratio between the amount of sensitized material under the reference conditions and the amount of sensitized material under the actual conditions has the influence on the coefficient of variation in the pattern width, and the coefficient of variation Cv is expressed as $$Cv = \{(1-a \times Ic)/(1-a \times Ico)\}^b \quad \text{Equation 1}$$

where a and b are variables depending upon the resolving power of the photo-resist. When a standard exposure system is used for pattern transfer to standard photo-resist, it is possible to assume the variables a and b to be 1.

Finally, the actual pattern width is predicted by multiplying the distance CDI by the coefficient of variation Cv. Thus, the actual pattern width Wact is expressed by the following equation.

$$Wact = CDI \times Cv = CDI \times \{(1-a \times Ic)/(1-a \times Ico)\}^b \quad \text{Equation 2}$$

DESCRIPTION OF THE PREFERRED EMBODIMENTS

First Embodiment

Description is hereinbelow made on a method for predicting a pattern width embodying the present invention and a method for correcting a mask pattern also embodying the present invention. In the first embodiment, an isolated line of 0.20 micron wide is transferred from a photo-mask to a positive photo-resist layer spread over a semiconductor wafer. The positive photo-resist has the variables a and b approximately equal to 1. A spherical aberration is predictive in the pattern transfer.

Figure 3:
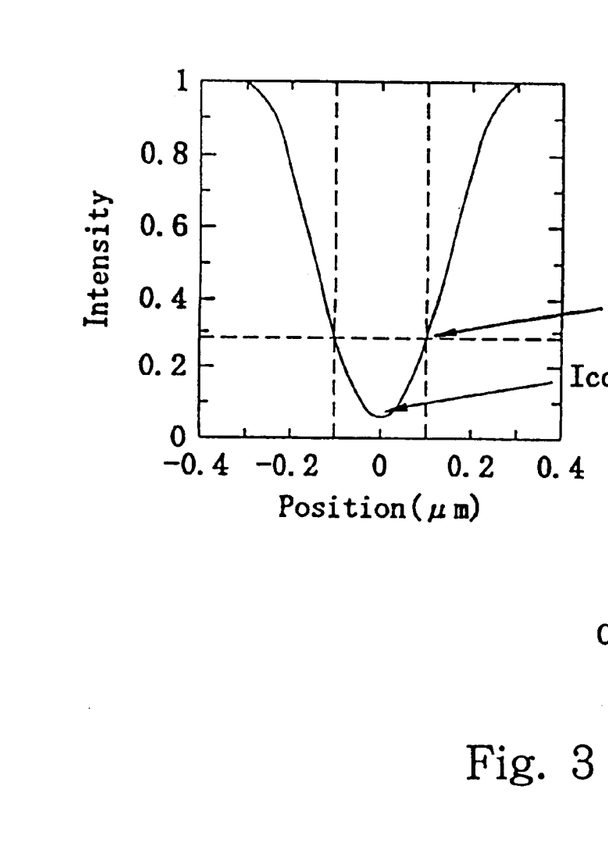
FIG. 3 is a graph showing an optical intensity of a pattern image varied with a position on a photo-sensitive layer under the conditions where a spherical aberration is assumed to be zero.

First, a spatial image of the isolated line is calculated under the reference conditions where the spherical aberration is zero. The optical intensity Ith at positions corresponding to the mask edge is calculated to be equal to 0.2872, i.e., Ith=0.2872. The optical intensity Ico at the center of the resist pattern is calculated to be equal to 0.0603, i.e., Ico=0.0603. The optical intensity is plotted as shown in FIG. 3.

Figure 4:
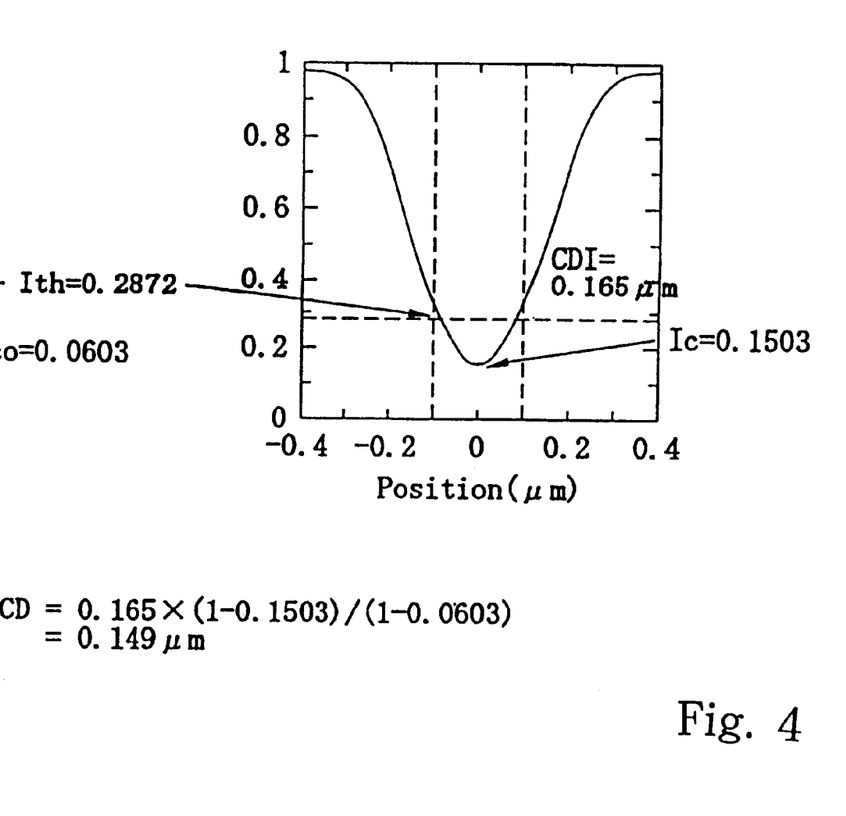
FIG. 4 is a graph showing an optical intensity of a pattern image varied with a position on a photo-sensitive layer under the conditions where the spherical aberration is assumed to 0.3 λ.

Subsequently, a spatial image of the isolated line is calculated under the actual conditions where the spherical aberration is 0.3 λ. The optical intensity is plotted as shown in FIG. 4. Broken line is drawn in the graph shown in FIG. 4 in such a manner as to pass the optical intensity Ith of 0.2872. Crossing points between the broken line and the plots are determined, and the distance CDI between the crossing points is measured. The distance CDI is 0.165 micron. The optical intensity Ic at the center of the resist image is calculated to be 0.1503.

Subsequently, the coefficient of variation CV is calculated by using Equation 1, and the pattern width CV in the resist pattern is predicted to be 0.149 micron by using Equation 2. The difference between CDI and CD is 0.016 micron, and is due to the difference of solubility of the positive photo-resist. In other words, the pattern width CD of the resist pattern is more accurate than the pattern width CDI predicted only on the basis of the optical intensity Ith.

Figure 5:
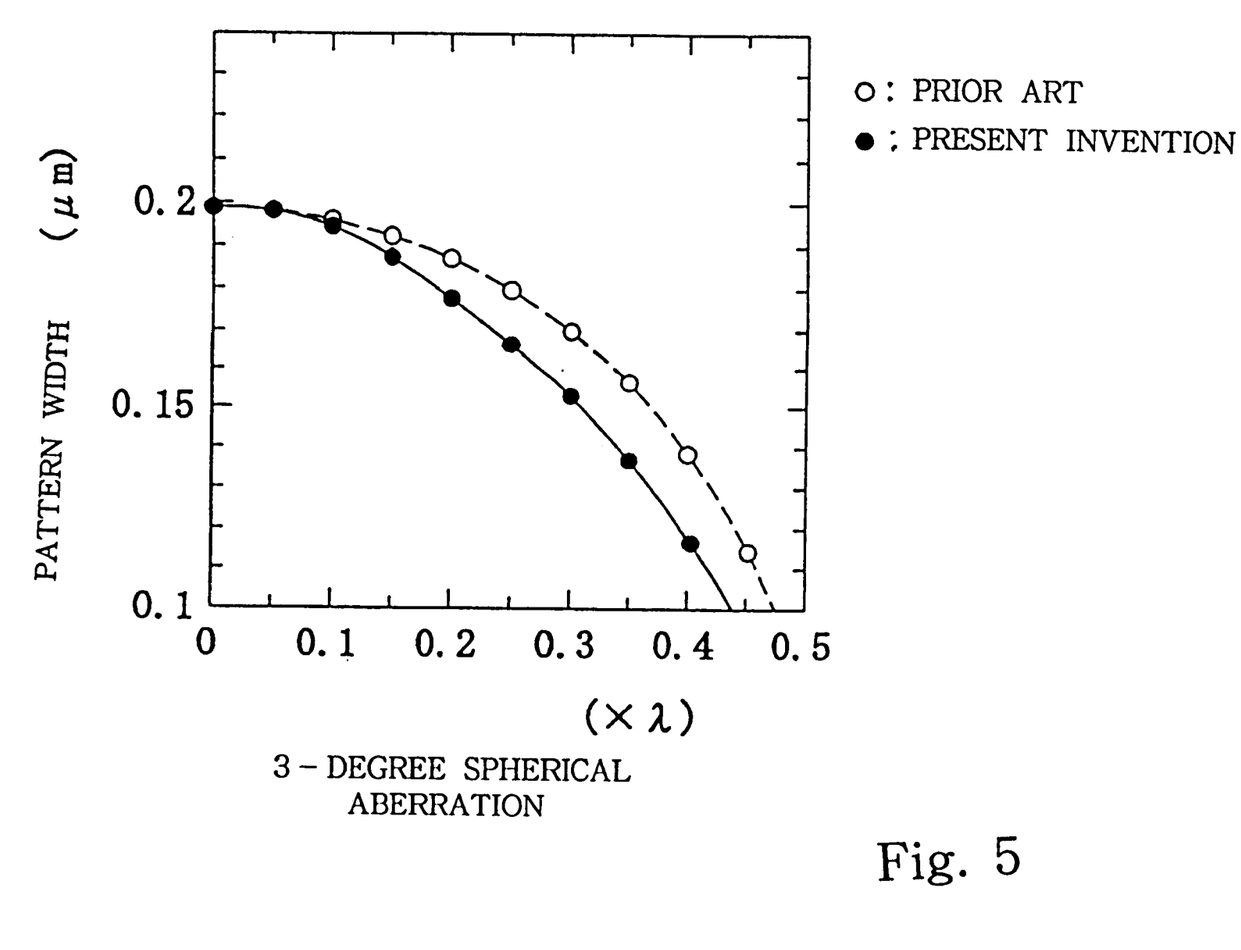
FIG. 5 is a graph showing relation between a pattern width predicted through a prior art method and a pattern width predicted through a method according to the present invention.

The pattern width CDI and the pattern width CD are plotted in FIG. 5. Comparing small circles with dots, the pattern width CD are narrower than the pattern width CDI at all times. When the spherical aberration is increased, the difference between the pattern widths CD and CDI is widened, and the solubility of the photo-resist has the strong influence on the pattern width.

The present inventor transferred the mask pattern to the positive photo-resist layer, and measured the pattern width. The pattern width CD was closer to the actual pattern width than the pattern width CDI. Thus, the method embodying the present invention is more accurate than the prior art method. Although the spherical aberration is taken into account, the other kinds of aberration are similarly taken into account, and are used in the method embodying the present invention.

The pattern width CD thus predicted through the method is fed back to the design work of the photo-mask. The pattern width CD is compared with a target pattern width to see whether or not the isolated line on the photo-mask is appropriate. If the answer is negative, the photo-mask is redesigned.

As will be understood from the foregoing description, the method according to the present invention takes the influence of the solubility on the resist pattern due to the difference of optical intensity into account, and obtains the prediction more accurate than the prediction through the prior art method. Even though the variation of solubility is taken into account, only equations 1 and 2 are added, and the method according to the present invention is not complicated.

Second Embodiment

In the second embodiment, an isolated line of 0.20 micron wide is also transferred from a photo-mask to a positive photo-resist layer spread over a semiconductor wafer. The positive photo-resist has the variables a and b approximately equal to 1. The defocus is predictive in the pattern transfer.

Figures 6, 7:
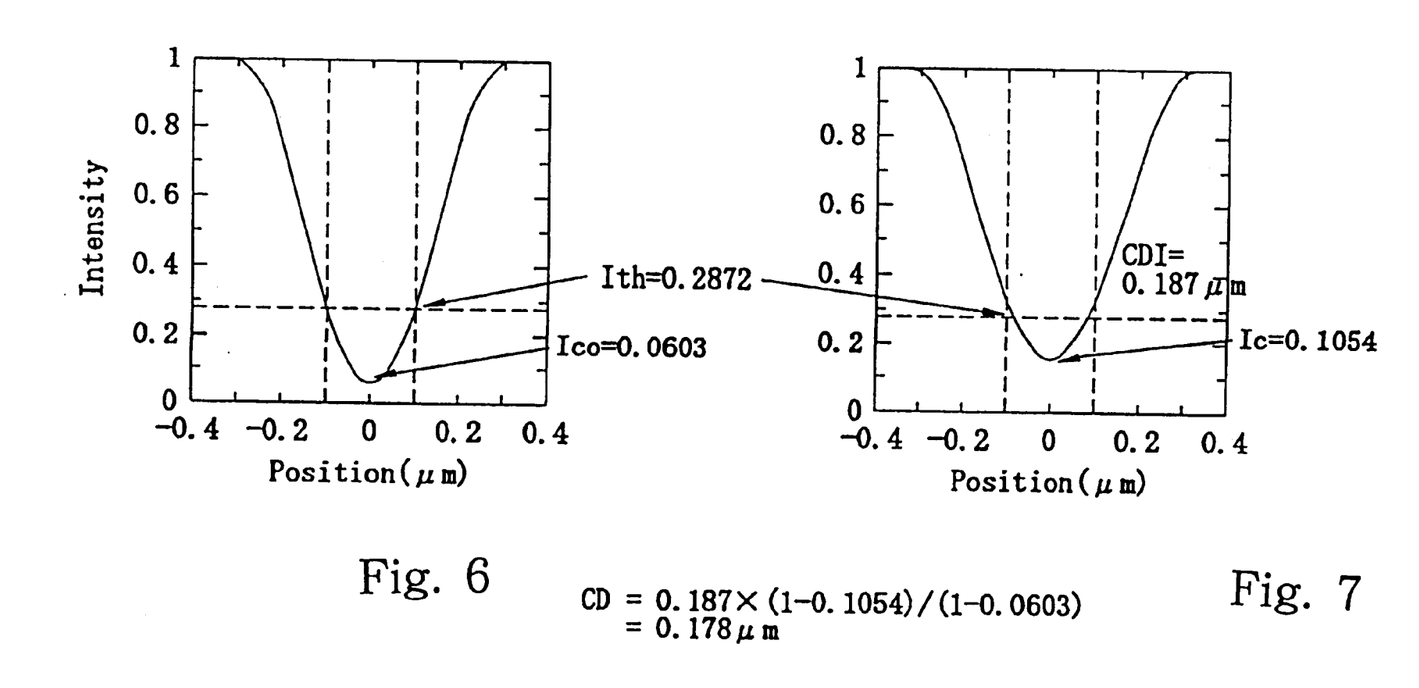
FIG. 6 is a graph showing an optical intensity of a pattern image varied with a position on a photo-sensitive layer under the conditions where a defocus is assumed to be zero.
FIG. 7 is a graph showing an optical intensity of a pattern image varied with a position on a photo-sensitive layer under the conditions where the defocus is assumed to 0.25 micron.

First, a spatial image of the isolated line is calculated under the reference conditions where the defocus is zero. The optical intensity Ith at positions corresponding to the mask edge is calculated to be equal to 0.2872, i.e., Ith=0.2872. The optical intensity Ico at the center of the resist pattern is calculated to be equal to 0.0603, i.e., Ico=0.0603. The optical intensity is plotted as shown in FIG. 6.

Subsequently, a spatial image of the isolated line is calculated under the actual conditions where the defocus is 0.25 micron. The optical intensity is plotted as shown in FIG. 7. Broken line is drawn in the graph shown in FIG. 7 in such a manner as to pass the optical intensity Ith of 0.2872. Crossing points between the broken line and the plots are determined, and the distance CDI between the crossing points is measured. The distance CDI is 0.187 micron. The optical intensity Ic at the center of the resist image is calculated to be 0.1054.

Subsequently, the coefficient of variation CV is calculated by using Equation 1, and the pattern width CV in the resist pattern is predicted to be 0.178 micron by using Equation 2. The difference between CDI and CD is 0.009 micron, and is due to the difference of solubility of the positive photo-resist. In other words, the pattern width CD of the resist pattern is more accurate than the pattern width CDI predicted only on the basis of the optical intensity Ith.

Figure 8:
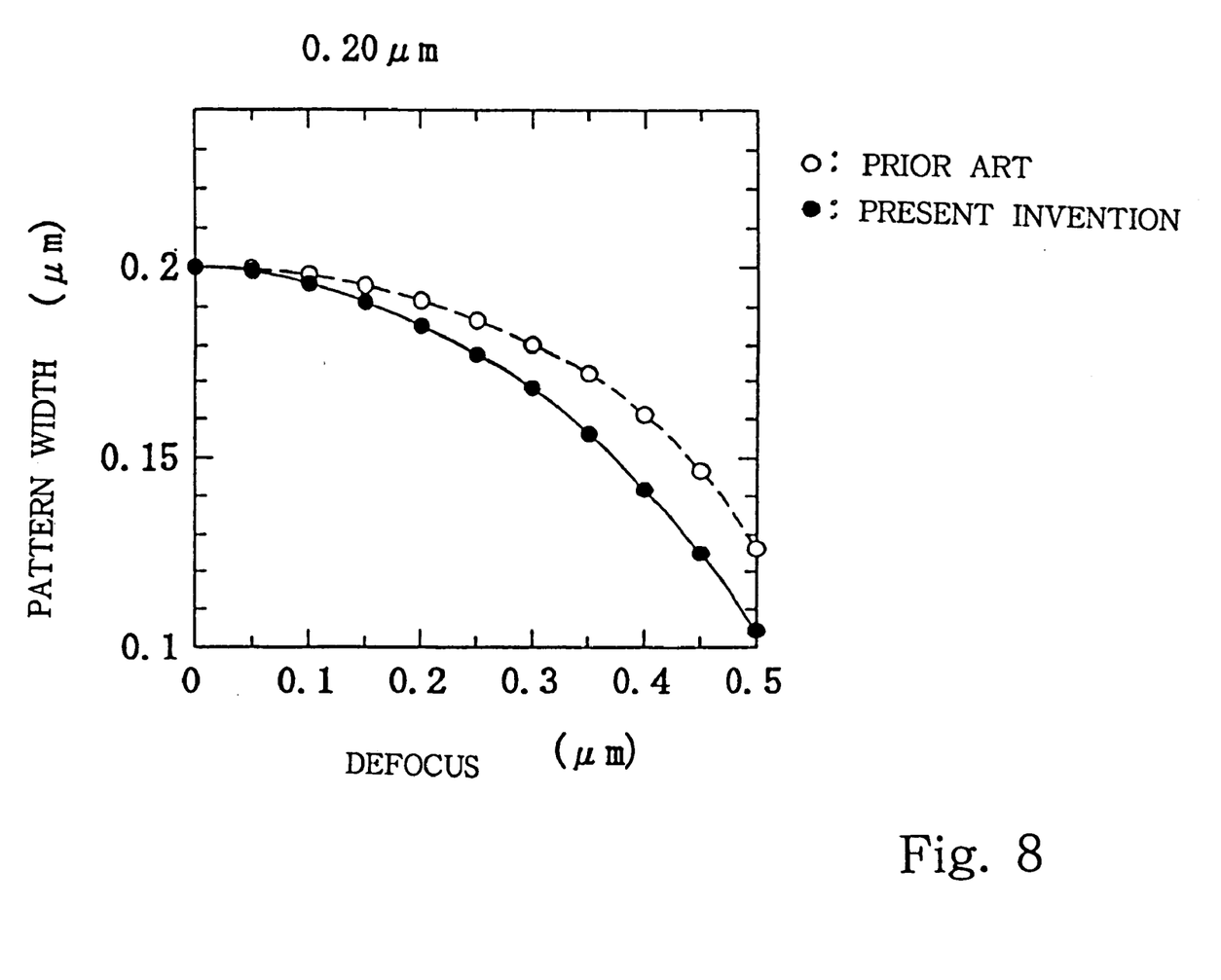
FIG. 8 is a graph showing relation between a pattern width predicted through the prior art method and the pattern width predicted through the method according to the present invention when the defocus is taken into account.

The pattern width CDI and the pattern width CD are plotted in FIG. 8. Comparing small circles with dots, the pattern width CD are narrower than the pattern width CDI at all times. When the defocus is increased, the difference between the pattern widths CD and CDI is widened, and the solubility of the photo-resist has the strong influence on the pattern width.

The present inventor transferred the mask pattern to the positive photo-resist layer, and measured the pattern width. The pattern width CD was closer to the actual pattern width than the pattern width CDI. Thus, the method embodying the present invention is more accurate than the prior art method.

The pattern width CD thus predicted through the method is fed back to the design work of the photo-mask. The pattern width CD is compared with a target pattern width to see whether or not the isolated line on the photo-mask is appropriate. If the answer is negative, the photo-mask is redesigned.

As will be understood from the foregoing description, the method according to the present invention takes the influence of the solubility on the resist pattern due to the difference of optical intensity into account, and obtains the prediction more accurate than the prediction through the prior art method. Even though the variation of solubility is taken into account, only equations 1 and 2 are added, and the method according to the present invention is not complicated.

Third Embodiment

In the third embodiment, an isolated line of 0.20 micron wide is also transferred from a photo-mask to a positive photo-resist layer spread over a semiconductor wafer. The positive photo-resist has the variables a and b approximately equal to 1. A dimensional error is predictive in the mask pattern.

Figure 9:
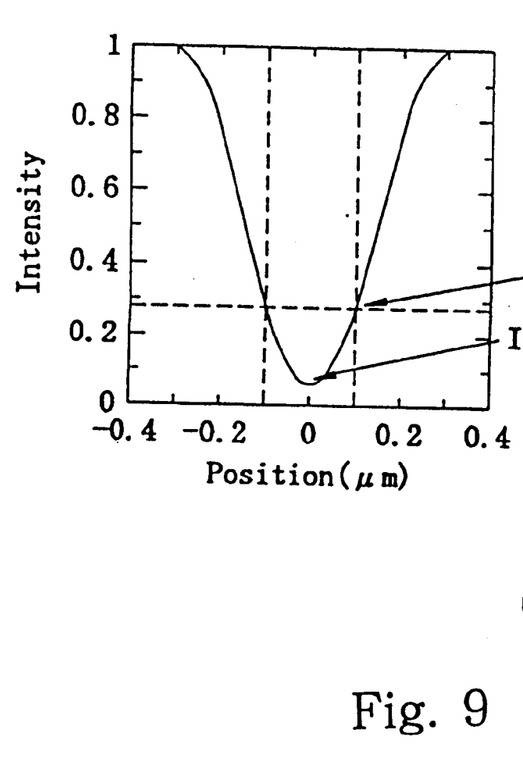
FIG. 9 is a graph showing an optical intensity of a pattern image varied with a position on a photo-sensitive layer under the conditions where a dimensional error is assumed to be zero.

First, a spatial image of the isolated line is calculated under the reference conditions where the dimensional error is zero. The optical intensity Ith at positions corresponding to the mask edge is calculated to be equal to 0.2872, i.e., Ith=0.2872. The optical intensity Ico at the center of the resist pattern is calculated to be equal to 0.0603, i.e., Ico=0.0603. The optical intensity is plotted as shown in FIG. 9.

Figure 10:
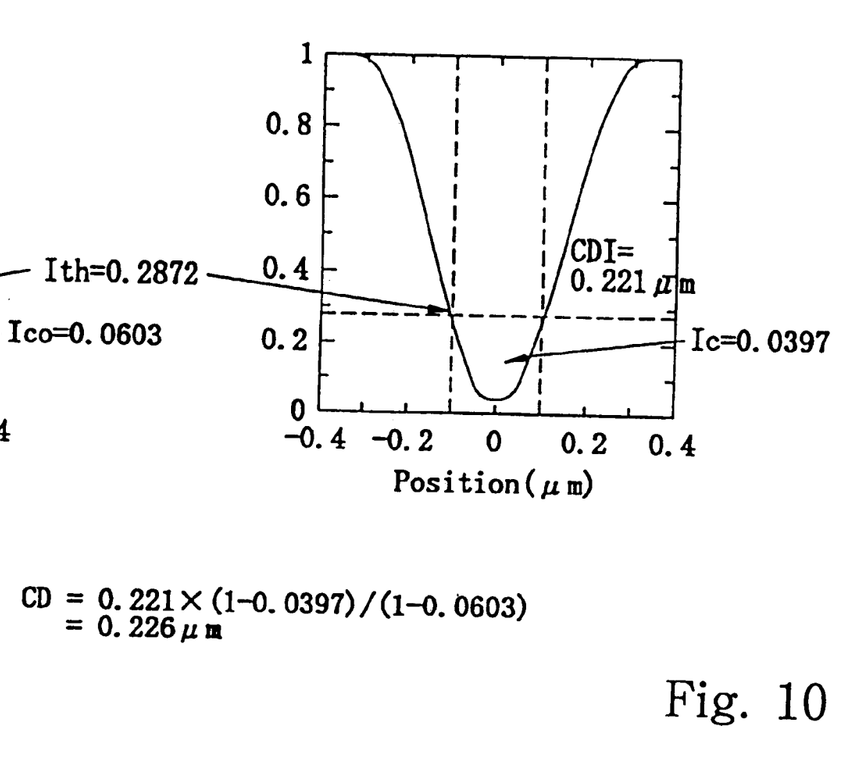
FIG. 10 is a graph showing an optical intensity of a pattern image varied with a position on a photo-sensitive layer under the conditions where the dimensional error is assumed to 0.02 micron.
Figure 11:
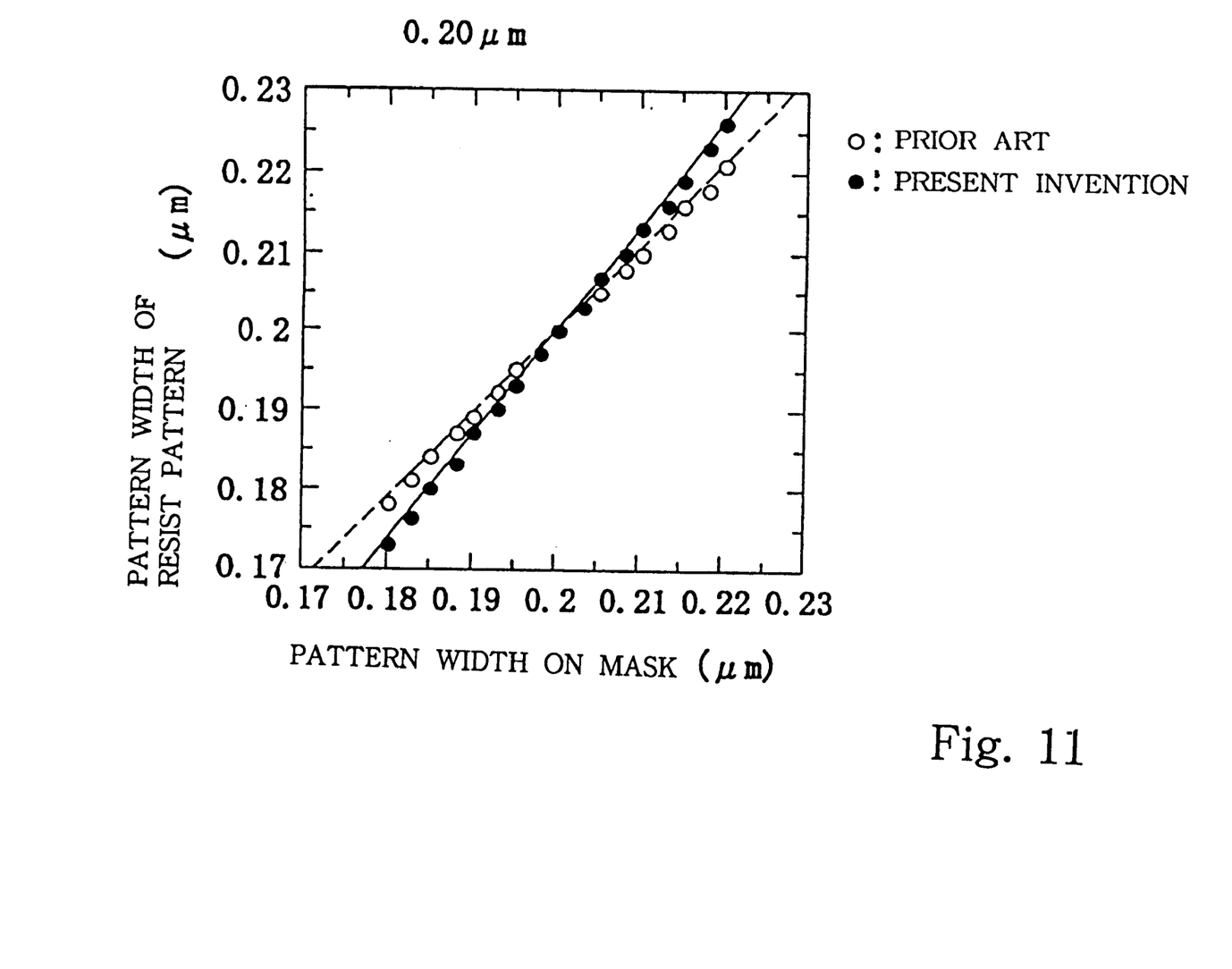
FIG. 11 is a graph showing relation between a pattern width predicted through the prior art method and the pattern width predicted through the method according to the present invention when the defocus is taken into account.

Subsequently, a spatial image of the isolated line is calculated under the actual conditions where the dimensional error is 0.02 micron. The optical intensity is plotted as shown in FIG. 10. Broken line is drawn in the graph shown in FIG. 10 in such a manner as to pass the optical intensity Ith of 0.2872. Crossing points between the broken line and the plots are determined, and the distance CDI between the crossing points is measured. The distance CDI is 0.221 micron. The optical intensity Ic at the center of the resist image is calculated to be 0.0397.

Subsequently, the coefficient of variation CV is calculated by using Equation 1, and the pattern width CV in the resist pattern is predicted to be 0.226 micron by using Equation 2. The pattern width CD is 0.005 micron wider than the pattern width CDI, and is due to the difference of solubility of the positive photo-resist. The pattern width CD of the resist pattern is more accurate than the pattern width CDI predicted only on the basis of the optical intensity Ith.

The pattern width CDI and the pattern width CD are plotted in FIG. 8. Comparing small circles with dots, the plots representative of the pattern width CD cross the plots representative of the pattern width CDI. When the pattern width on the photo-mask is less than 0.2 micron, the pattern width CD is narrower than the pattern width. However, when the pattern width on the photo-mask is greater than 0.2 micron, the pattern width CD is wider than the pattern width CDI.

The present inventor transferred the mask pattern to the positive photo-resist layer, and measured the pattern width. The pattern width CD was closer to the actual pattern width than the pattern width CDI. Thus, the method embodying the present invention is more accurate than the prior art method.

The pattern width CD thus predicted through the method is fed back to the design work of the photo-mask. The pattern width CD is compared with a target pattern width to see whether or not the isolated line on the photo-mask is appropriate. If the answer is negative, the photo-mask is redesigned.

As will be understood from the foregoing description, the method according to the present invention takes the influence of the solubility on the resist pattern due to the difference of optical intensity into account, and obtains the prediction more accurate than the prediction through the prior art method. Even though the variation of solubility is taken into account, only equations 1 and 2 are added, and the method according to the present invention is not complicated.

Fourth Embodiment

The present inventor assumes the actual conditions to contain the spherical aberration of 0.3 λ, the defocus of 0.25 micron and the dimensional error of 0.02 micron. The present inventor predicted the pattern width of the isolated line through the prior art method and through the method according to the present invention. The pattern width predicated through the prior art method was on the broken line in FIG. 12, and the pattern width predicated through the method according to the present invention was on the real line.

Figure 12:
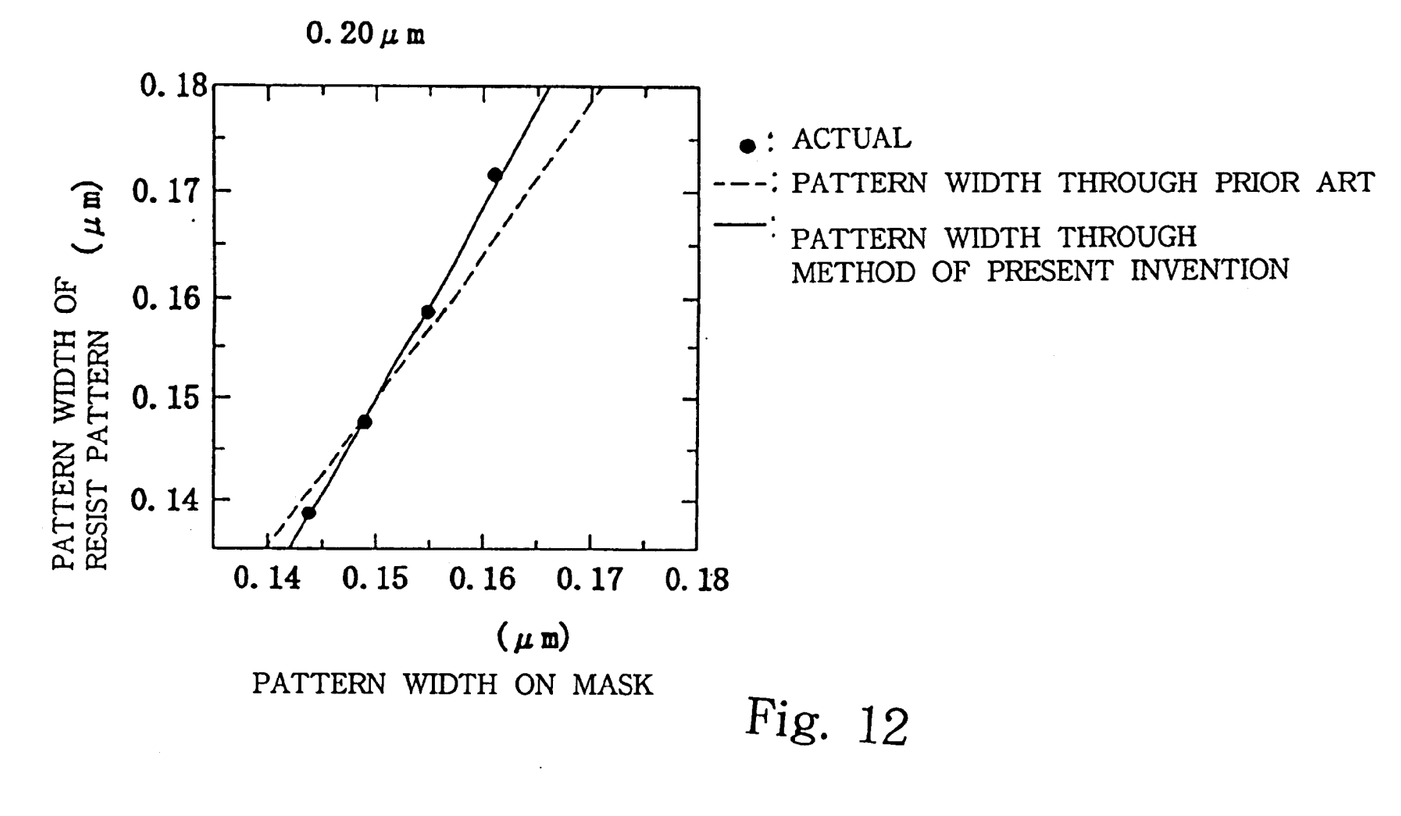
FIG. 12 is a graph showing relation between a pattern width predicted through the prior art method and the pattern width predicted through the method according to the present invention when the spherical aberration, the defocus and the dimensional error are taken into account.

The present inventor transferred isolated lines different in width to the positive photo-resist mask, and measured the actual width of the resist patterns. Dots were indicative of the actual width. The actual width was on the real line. Thus, the present inventor confirmed that the pattern width was accurately predicted through the method according to the present invention.

As will be appreciated from the foregoing description, the difference in solubility due to the difference in optical intensity is taken into account. The resist pattern is accurately predicted through the method according to the present invention. Only two equations are increased, and the method according to the present invention is never complicated.

Although particular embodiments of the present invention have been shown and described, it will be apparent to those skilled in the art that various changes and modifications may be made without departing from the spirit and scope of the present invention.

When an image is transferred from a photo mask to a layer of negative photo-resist layer, the resist pattern is accurately predicted through the method according to the present invention.

When a line-and-space pattern is transferred to a photo-resist layer, the method according to the present invention is applicable. In general, the line-and-space pattern is more accurately transferred to the photo-resist layer than the isolated line is. For this reason, the manufacturer would like to predict the resist pattern of an isolated line through the method according to the present invention.

What is claimed is:

1. A method for predicting a width of a pattern transferred from a photo-mask to a photo-sensitive layer, comprising the steps of:
   a) determining a first optical intensity at first positions on said photo-sensitive layer corresponding to edges of said photo-mask and a second optical intensity at a second position where the optical intensity is predicted to be weaker than said first optical intensity on the basis of a first spatial image of said pattern calculated under reference exposure conditions;
   b) determining a distance between third positions approximately equal in optical intensity to said first positions and a third optical intensity at a fourth position corresponding to said second position on the basis of a second spatial image of said pattern calculated under actual exposure conditions; and
   c) predicating said width of said pattern formed in said photo-sensitive layer on the basis of said distance, said second optical intensity and said third optical intensity.

2. The method as set forth in claim 1, in which said second position is at a center of an image of said pattern on said photo-sensitive layer.

3. The method as set forth in claim 1, in which an aberration is difference between said reference exposure conditions and said actual exposure conditions.

4. The method as set forth in claim 3, in which said aberration in said reference exposure conditions is zero.

5. The method as set forth in claim 3, in which said aberration is a spatial aberration.

6. The method as set forth in claim 1, in which a defocus is difference between said reference exposure conditions and said actual exposure conditions.

7. The method as set forth in claim 6, in which said defocus in said reference exposure conditions is zero.

8. The method as set forth in claim 1, in which a dimensional error in said pattern on said photo-mask is difference between said reference exposure conditions and said actual exposure conditions.

9. The method as set forth in claim 8, in which said dimensional error in said reference exposure conditions is zero.

10. The method as set forth in claim 1, in which an aberration, a defocus and a dimensional error are difference between said reference exposure conditions and said actual exposure conditions.

11. The method as set forth in claim 10, in which said aberration, said defocus and said dimensional error in said reference exposure conditions are zero.

12. The method as set forth in claim 1, in which said second optical intensity and said third optical intensity are assumed to be proportional to the first amount of photo-sensitive material to be converted in said photo-sensitive layer through the pattern transfer under said reference conditions and the second amount of said photo-sensitive material to be converted in said photo-sensitive layer through the pattern transfer under said actual conditions.

13. The method as set forth in claim 12, in which said distance is multiplied by the ratio between said second optical intensity and said third optical intensity for predicting said width of said pattern.

14. The method as set forth in claim 13, in which said ratio is calculated by using the equation expressed as $$Cv=\{(1-a \times Ic)/(1-a \times Ico)\}^b$$

Where Cv is said ratio and a and b are variables depending upon the resolving power of said photo-sensitive material.

15. A method for correcting a pattern to be transferred from a photo-mask to a photo-sensitive layer, comprising the steps of:
   a) determining a first optical intensity at first positions on said photo-sensitive layer corresponding to edges of said photo-mask and a second optical intensity at a second position where the optical intensity is predicted to be weaker than said first optical intensity on the basis of a first spatial image of said pattern calculated under reference exposure conditions;
   b) determining a distance between third positions approximately equal in optical intensity to said first positions and a third optical intensity at a fourth position corresponding to said second position on the basis of a second spatial image of said pattern calculated under actual exposure conditions;
   c) predicating said width of said pattern formed in said photo-sensitive layer on the basis of said distance, said second optical intensity and said third optical intensity;
   d) comparing said width predicated at step c) with a target width to see whether or not said pattern on said photo-mask is appropriate; and
   e) redesigning said photo-mask when the answer at step d) is given negative.

16. The method as set forth in claim 15, in which said second position is at a center of an image of said pattern on said photo-sensitive layer.

17. The method as set forth in claim 15, in which an aberration is difference between said reference exposure conditions and said actual exposure conditions.

18. The method as set forth in claim 15, in which a defocus is difference between said reference exposure conditions and said actual exposure conditions.

19. The method as set forth in claim 15, in which a dimensional error is difference between said reference exposure conditions and said actual exposure conditions.

20. The method as set forth in claim 15, in which said distance is multiplied by the ratio between said second optical intensity and said third optical intensity for predicting said width of said pattern.

21. The method as set forth in claim 20, in which said ratio is calculated by using the equation expressed as $$Cv = \{(1 - a \times Ic)/(1 - a \times Ico)\}^b$$

where Cv is said ratio and a and b are variables depending upon the resolving power of said photo-sensitive material.

* * * * *